(12) United States Patent
Hayashi

(10) Patent No.: US 6,987,271 B1
(45) Date of Patent: Jan. 17, 2006

(54) CHAMBER SENSOR PORT, CHAMBER AND ELECTRON BEAM PROCESSOR

(75) Inventor: Daisuke Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 94 days.

(21) Appl. No.: 10/480,652

(22) PCT Filed: Jun. 25, 2002

(86) PCT No.: PCT/JP02/06346

§ 371 (c)(1),
(2), (4) Date: Dec. 29, 2003

(87) PCT Pub. No.: WO03/003433

PCT Pub. Date: Jan. 9, 2003

(30) Foreign Application Priority Data

Jun. 28, 2001 (JP) ........................... 2001-1950792

(51) Int. Cl.
*G01F 23/00* (2006.01)
*G01F 1/68* (2006.01)

(52) U.S. Cl. .............................. 250/441.11; 73/204.22
(58) Field of Classification Search ............ 250/441.11
See application file for complete search history.

(56) References Cited

U.S. PATENT DOCUMENTS

| | | | | |
|---|---|---|---|---|
| 5,563,339 A | * | 10/1996 | Compton et al. | 73/64.45 |
| 5,824,896 A | * | 10/1998 | Lee | 73/238 |
| 6,854,326 B2 | * | 2/2005 | Watanabe et al. | 73/204.22 |
| 2002/0073773 A1 | * | 6/2002 | Uramachi et al. | 73/204.22 |

FOREIGN PATENT DOCUMENTS

| | | |
|---|---|---|
| JP | 59-224115 | 12/1984 |
| JP | 60-534 | 1/1985 |
| JP | 63-7155 | 1/1988 |
| JP | 5-264388 | 10/1993 |
| JP | 6-29247 | 2/1994 |
| JP | 10-153513 | 6/1998 |
| JP | 10-281911 | 10/1998 |
| JP | 2000-162161 | 6/2000 |

* cited by examiner

*Primary Examiner*—John R. Lee
*Assistant Examiner*—Paul M. Gurzo
(74) *Attorney, Agent, or Firm*—Oblon, Spivak, McClelland, Maier & Neustadt, P.C.

(57) ABSTRACT

A pressure sensing port includes an inner block airtightly attached to an inside of a port attachment opening and having a first through hole extending along the axis of the port attachment opening and an intermediate block airtightly attached adjacently to an axially outer surface of the inner block. The intermediate block has a second hole extending through axially in a position where the second through hole is not superposed on the first through hole and communicating with the first through hole through a gap formed between the inner block and the intermediate block. An outer block is airtightly attached between the inner block and intermediate block and has a third through hole extending axially in a position where the third through hole is not superposed on both the first and the second through hole and communicating with the first and the second through hole.

14 Claims, 8 Drawing Sheets

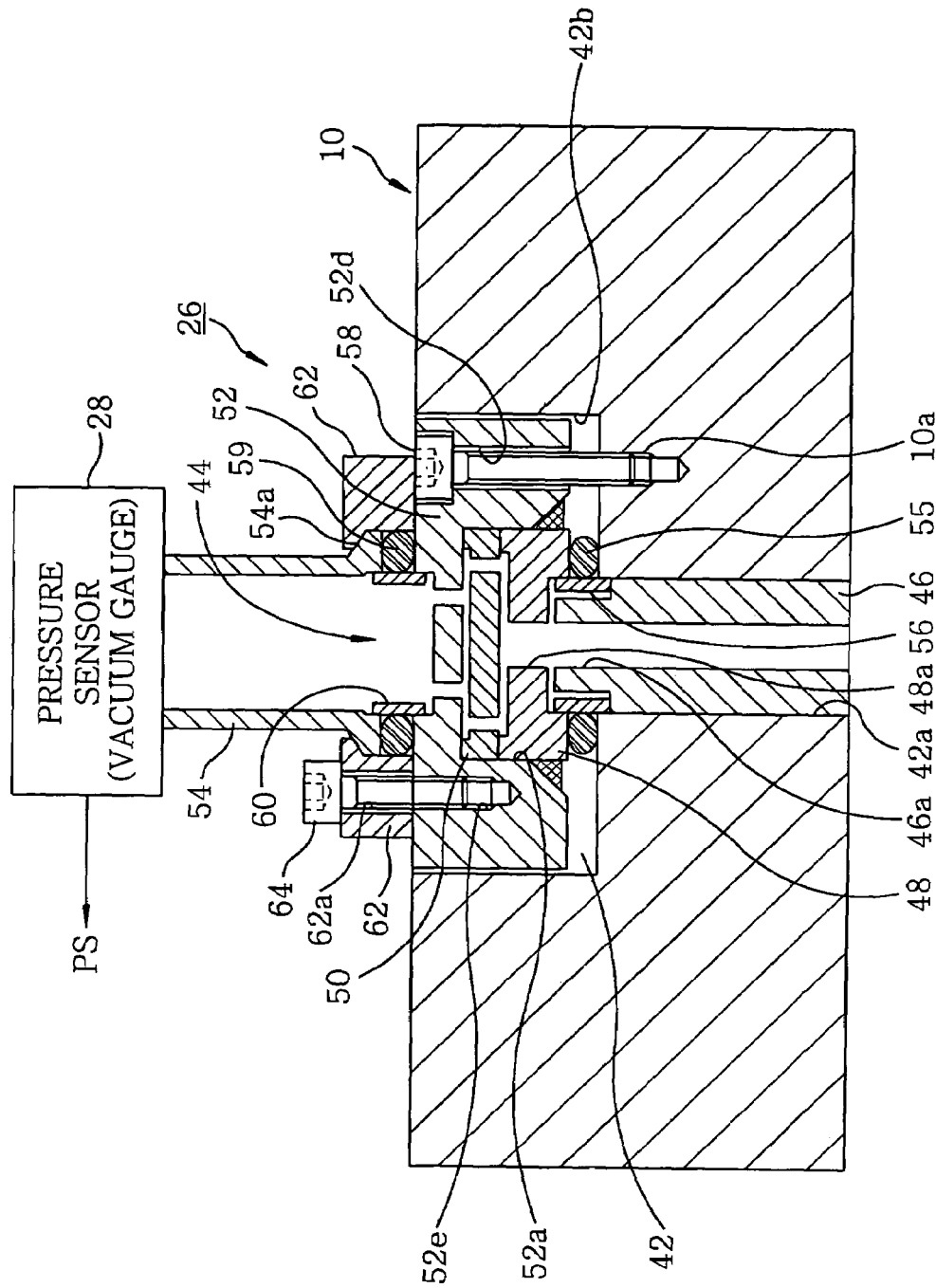

FIG.9

| BLOCK | HOLE DIAMETER [mm] | AREA OF A HOLE [mm²] | NUMBER OF HOLES | LENGTH OF PERIPHERY OF A HOLE | DISTANCE BETWEEN BLOCKS [mm] | SUM OF AREA OF HOLES [mm²] | PERIPHERAL AREA OF HOLES [mm²] |
|---|---|---|---|---|---|---|---|
| OUTER BLOCK 52 | 3 | $S_c$ =7.065 | $N_c$ =4 | $L_c$ =9.42 | | $S_c * N_c$ =28.26 | |
| | | | | | $G_{bc}$ =1 | | $L_c * N_c * G_{bc}$ =37.6 $L_b * N_b * G_{bc}$ =37.6 |
| INTERMEDIATE BLOCK 50 | 3 | $S_b$ =7.065 | $N_b$ =4 | $L_b$ =9.42 | | $S_b * N_b$ =28.26 | |
| | | | | | $G_{ab}$ =1.5 | | $L_b * N_b * G_{ab}$ =56.52 $L_a * N_a * G_{ab}$ =28.26 |
| INNER BLOCK 48 | 6 | $S_a$ =28.26 | $N_a$ =1 | $L_a$ =18.84 | | $S_a * N_a$ =28.26 | |

CHAMBER SENSOR PORT, CHAMBER AND ELECTRON BEAM PROCESSOR

FIELD OF THE INVENTION

The present invention relates to a chamber sensor port and a chamber for use in a semiconductor manufacturing apparatus and the like, and an electron beam processor.

BACKGROUND OF THE INVENTION

In general, a semiconductor manufacturing apparatus provided with a vacuum chamber serving as a processing room includes a pressure sensor installed on an outside of a wall of the chamber. The pressure sensor is connected to the vacuum chamber via a chamber pressure sensing port airtightly installed through the wall of the chamber in order to measure and manage a pressure or a vacuum level inside the chamber. In the prior art, a partition type shielding plate, which blocks contaminants, is provided in front of the chamber pressure sensing port so as to prevent the contaminants generated in the vacuum chamber from getting into and adhering to the pressure sensor through the chamber pressure sensing port.

However, when a semiconductor manufacturing apparatus for irradiating electron beams onto a substrate to be processed (a semiconductor wafer) in a vacuum chamber, e.g., an electron beam annealing equipment, outputs accelerated electrons of high energy into the chamber, X-rays are generated and scattered in the chamber to cause problems of being leaked out of the vacuum chamber through the chamber pressure sensing port.

It is generally known that a material with a narrow lattice spacing or a heavy material such as lead, stainless steel (SUS), lead-containing glass (containing 75% PbO) and the like can shield or attenuate the X-rays. However, even with the partition type shielding plate made of the material with a narrow lattice spacing, it is difficult to effectively shield a conventional pressure sensing port from the X-rays scattering in random directions. Further, the port opening area should be reduced in order to increase the degree of shielding or covering, thereby deteriorating a pressure sensing response characteristic.

SUMMARY OF THE INVENTION

It is, therefore, an object of the present invention to provide a chamber sensor port, a chamber, and an electron beam processor, which are capable of guaranteeing a satisfactory physical quantity sensing response characteristic and, at the same time, blocking radioactive rays completely.

In accordance with a first aspect of the present invention, there is provided a chamber sensor port which connects a sensor for measuring a physical quantity inside a chamber to an inside of the chamber, the sensor being installed on an outside of a wall of the chamber, the chamber sensor port including: a port attachment opening formed by running through the wall of the chamber; a first block airtightly installed at an inside of the port attachment opening and including one or more first through holes running through in a direction of an axis of the port attachment opening; and a second block airtightly installed at the inside of the port attachment opening, the second block being disposed adjacent to an axially outer surface of the first block and including one or more second through holes running through in the direction of the axis of the port attachment opening, the second through holes being disposed at locations not overlapping with those of the first through holes and communicating with the first through holes through a gap formed between the first and the second block.

In accordance with the present invention, the chamber can be smoothly connected to the sensor through a communication path formed along the first and the second through holes and the gap between the first block and the second block. Since the second through holes run through in the direction of the axis of the port attachment opening with the positions of the second through holes being disposed at locations not overlapping with those of the first through holes, the communication path forms a labyrinth. Accordingly, because of a double layer block structure having the labyrinth formed by the first and the second blocks, at least one of the first and the second blocks can block radioactive rays getting into the chamber sensor port from the chamber in random directions.

It is preferable that the first and the second blocks are made of materials capable of blocking radioactive rays (e.g., X-rays). In this case, it is preferable that each of the first and the second blocks has a sheet thickness capable of blocking radioactive rays (e.g., X-rays) incident thereto from an inside of the chamber. For example, each of the first and the second blocks can be made of stainless steel having a sheet thickness greater than or equal to 8 mm. In that case, at least one of the first and the second blocks can effectively block the radioactive rays invading from the chamber into the chamber sensor port in random directions.

In accordance with another preferred embodiment of the present invention, there is provided a chamber sensor port further including a third block airtightly installed between the first block and the second block and including one or more third through holes running through in the direction of the axis of the port attachment opening, the third through holes being disposed at locations not overlapping with those of the first and the second through holes and communicating with the first and the second through holes through a gap formed between the first block and the third block and a gap formed between the second block and the third block, respectively.

With the above-described configuration, a side of the chamber can be smoothly connected to a side of the sensor through a communication path formed along the first, the second, and the third through holes and all gaps formed between the second block and the third block and between the first block and the third block. Since the third through holes run through in the direction of the axis of the port attachment opening with the positions of the third through holes being disposed at locations not overlapping with those of the first and the second through holes, the communication path forms a labyrinth. With a triple layer block structure of the first, the second, and the third block, at least two blocks can cooperatively block radioactive rays (e.g., X-rays) invading from the chamber into the chamber sensor port in the random direction. Thus, a size of the chamber sensor port can be reduced by minimizing a sheet thickness of layer of each block, while securing a sufficiently large opening area due to the labyrinth structure of the triple layer block. At this time, it is preferable that each of the first, the second, and the third blocks is made of materials capable of blocking radioactive rays (e.g., X-rays) and each block has a sheet thickness greater than or equal to a half of a sheet thickness capable of blocking radioactive rays (e.g., X-rays) incident thereto from an inside of the chamber. Accordingly, it is possible to effectively block radioactive rays, e.g., X-rays, getting into the chamber sensor port.

Moreover, each of the first, the second, and the third block can be made of stainless steel having a sheet thickness greater than or equal to 4 mm, thereby maintaining a sum of sheet thicknesses of each block in an axial direction to be greater than 8 mm at any place in the communication path from the chamber to the sensor. For example, radioactive rays such as X-rays can be effectively blocked by stainless steel having a sheet thickness greater than or equal to 8 mm.

Besides, it is preferable that each block, more preferably every block, in the chamber sensor port is made of stainless steel capable of effectively blocking radioactive rays without causing environmental problems.

It is also preferable that a first pipe airtightly attached to an inside of the port attachment opening with the first pipe being disposed adjacent to an inside of the sidewall of the chamber. Accordingly, radioactive rays invading from the chamber can be blocked without leaking outwards and then can be completely blocked, to thereby achieve a multi layer block structure. The first pipe preferably has a diameter allowing the first through holes to be therewithin. For example, by disposing a first through hole with an axis thereof being coincident with that of the port attachment opening in the first block, the first pipe can be disposed, with the axis thereof being coincident with that of the first through hole. And also, if the first pipe is airtightly attached to the first block through a center axis fitting ring around which an O-ring is placed, a satisfactory sealing can be generated. The first pipe can be made of stainless steel.

Still further, the second pipe extending to the sensor can be airtightly attached to an outer sidewall of the chamber of the second block and have a diameter allowing the second through holes to be therewithin. Moreover, the center axis fitting ring around which the O-ring is placed can be installed between the second pipe and the second block.

In accordance with a second aspect of the present invention, there is provided a chamber including a chamber sensor port which connects a sensor for measuring a physical quantity inside a chamber to an inside of the chamber, the sensor being installed on an outside of a wall of the chamber, the chamber sensor port including: a port attachment opening formed by running through the wall of the chamber; a first block airtightly installed at an inside of the port attachment opening and including one or more first through holes running through in a direction of an axis of the port attachment opening; and a second block airtightly installed at the inside of the port attachment opening, the second block being disposed adjacent to an axially outer surface of the first block and including one or more second through holes running through in the direction of the axis of the port attachment opening, the second through holes being disposed at locations not overlapping with those of the first through holes and communicating with the first through holes through a gap formed between the first and the second block.

In accordance with a third aspect of the present invention, there is provided an electron beam processor including a chamber sensor port which connects a sensor for measuring a physical quantity inside a chamber to an inside of the chamber, the sensor being installed on an outside of a wall of the chamber, the chamber sensor port including: a port attachment opening formed by running through the wall of the chamber; a first block airtightly installed at an inside of the port attachment opening and including one or more first through holes running through in a direction of an axis of the port attachment opening; and a second block airtightly installed at the inside of the port attachment opening, the second block being disposed adjacent to an axially outer surface of the first block and including one or more second through holes running through in the direction of the axis of the port attachment opening, the second through holes being disposed at locations not overlapping with those of the first through holes and communicating with the first through holes through a gap formed between the first and the second block.

Because the double layer block structure having the labyrinth is also formed by the first and the second blocks in accordance with the second and the third preferred embodiments of the present invention, at least one of the first and the second blocks can block radioactive rays invading from the chamber into the chamber sensor port in random directions.

BRIEF DESCRIPTION OF THE DRAWINGS

FIG. 4 depicts a cross sectional view of a chamber pressure sensing port;

FIGS. 5A and 5B present a configuration of an inner block disposed in the chamber pressure sensing port, wherein FIG. 5A is a plan view of the inner block seen at a pressure sensor side and FIG. 5B is a cross sectional view of the inner block;

FIGS. 6A and 6B represent a configuration of an intermediate block disposed in the pressure sensing port, wherein FIG. 6A is a plan view of the intermediate block seen at the pressure sensor side and FIG. 6B is a cross sectional view of the intermediate block;

FIGS. 7A and 7B offer a configuration of an outer block disposed in the pressure sensing port, wherein FIG. 7A is a plan view of the outer block seen at the pressure sensor side and FIG. 7B is a cross sectional view of the outer block;

FIG. 9 sets forth numerical values of the through holes, the gaps and the like in the triple layer block structure of FIG. 8.

Explanation about Reference Numbers

| 10 | chamber | 26 | pressure sensing port |
| 28 | vacuum gauge | 44 | port assembly |
| 46 | tube | 48 | inner block |
| 50 | intermediate block | 52 | outer block |
| 54 | tube | 55 | O-ring |
| 56 | center axis fitting ring | | |
| 59 | O-ring | | |
| 60 | Center axis fitting ring | | |

DETAILED DESCRIPTION OF THE PREFERRED EMBODIMENTS

Hereinafter, an electron beam processor in accordance with a preferred embodiment of the present invention will be described in detail with reference to the accompanying drawings.

Figure 1:
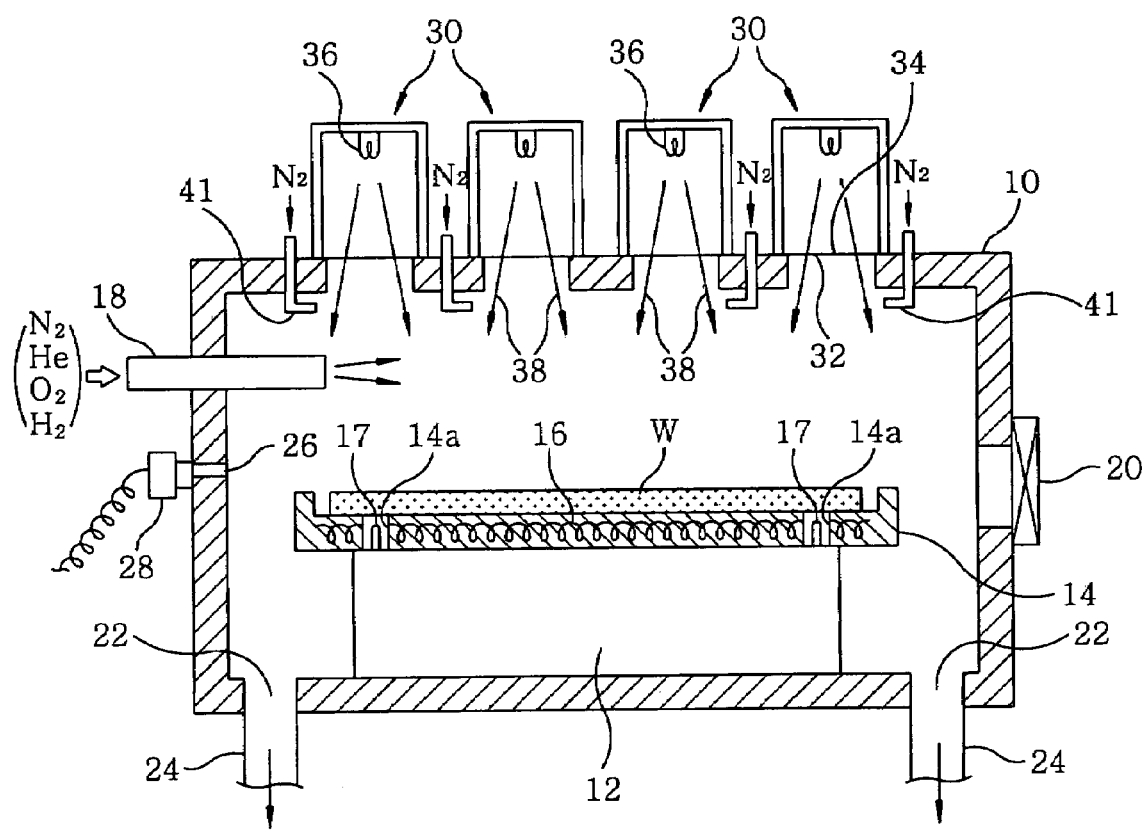
FIG. 1 shows a cross sectional view of a processor to which the present invention can be applied.

Referring to FIG. 1, there is illustrated an electron beam processor (hereinafter, referred to as the "processor") adopting a pressure sensing port that is an example of the chamber sensor port in accordance with the present invention. The processor irradiates electron beams onto the entire top surface (a surface to be processed) of a substrate to be processed, e.g., a semiconductor wafer W, in a vacuum processing room, to thereby perform a predetermined process.

The processor has a chamber 10 as a processing room, wherein the chamber 10 can be vacuum-sealed and has a box or a cylindrical shape having closed top and bottom surfaces. It is preferable that the chamber 10 is made of, e.g., aluminum. A susceptor 14 is horizontally installed on a support or supporting member 12 disposed on a central portion of a bottom surface of the chamber 10. The susceptor 14 is formed by shaping, e.g., a carbon material or an aluminum compound such as AlN in the form of a circular plate and, further, includes therein a resistance heater 16 serving as a heating device. A plurality of, e.g., three, through holes 14a are disposed at regular intervals in the susceptor 14. A lifter pin 17 is provided to be vertically movable through each of the through holes 14a by an elevator (not shown) between a position higher than the susceptor 14 (a wafer transferring position) and a position lower than the susceptor 14 (a retracted position).

Attached airtightly to a sidewall of the chamber 10 are a processing gas nozzle 18 which serves as a gas supply unit for providing required processing gases (e.g., $N_2$, He, $O_2$, and $H_2$) into the chamber and a gate valve 20 which is opened and closed when the semiconductor wafer W is loaded into or unloaded from the chamber.

An exhaust port 22 is provided at a periphery portion of the bottom surface of the chamber 10 and is connected to a vacuum pump (not shown) via an exhaust path 24. An inner space of the chamber 10 can be depressurized to a desired vacuum level by the vacuum pump. In order to measure a pressure as a physical quantity in the chamber 10, a pressure sensing port 26, which will be described later, is installed through the sidewall of the chamber 10, and a vacuum gauge 28 functioning as a pressure sensor is attached to an end portion of the pressure sensing port 26.

Figure 2:
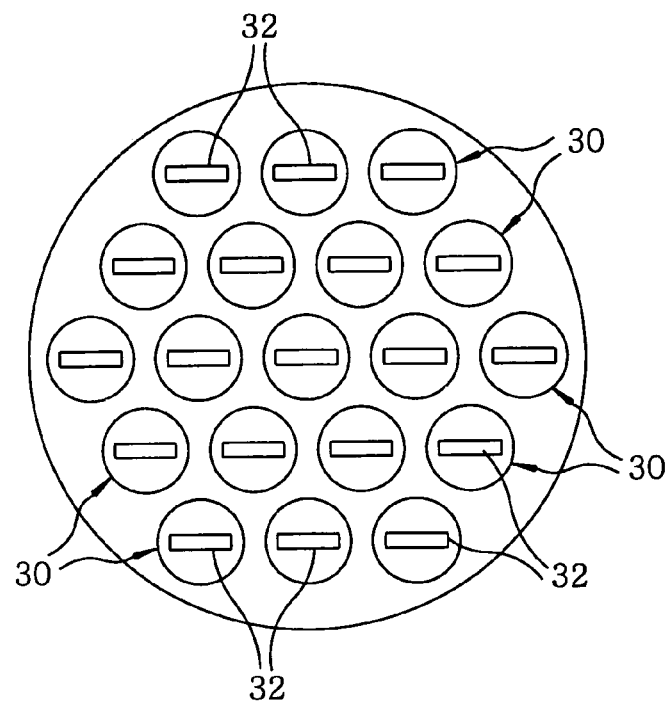
FIG. 2 illustrates an arrangement of electron beam tubes disposed at a ceiling portion of a chamber in the processor of FIG. 1.

A plurality of electron beam tubes 30 are installed at a ceiling portion of the chamber 10. Specifically, the electron beam tubes 30 are substantially uniformly spaced apart (in a substantially uniform distribution density) over an almost entire ceiling portion of the chamber 10, e.g., as illustrated in FIG. 2 in order that electron beams can be emitted to an entire upper surface (a surface to be processed) of the semiconductor wafer W loaded on the susceptor 14 from the ceiling surface disposed directly thereabove. Each electron beam tube 30 has an emission window 32 attached to a bottom portion thereof, the emission window 32 being of a rectangular shape and coated with a thin silicon film 34 capable of transmitting electron beams.

A filament 36 is installed in each electron beam tube 30. Electrons, which are generated from the filament 36 and accelerated in a beam shape by using an accelerating electrode (not shown), get into the chamber 10 through the corresponding emission window 32. The electron beams 38 introduced into the chamber 10 are diverged to be irradiated onto the semiconductor wafer W. During the process, X-rays are generated at the time when accelerated electrons are emitted through the silicone film 34 of each electron beam tube 30. The X-rays thus produced owing to the generation of the electron beams 38 are scattered in random directions inside the chamber 10.

Figure 3:
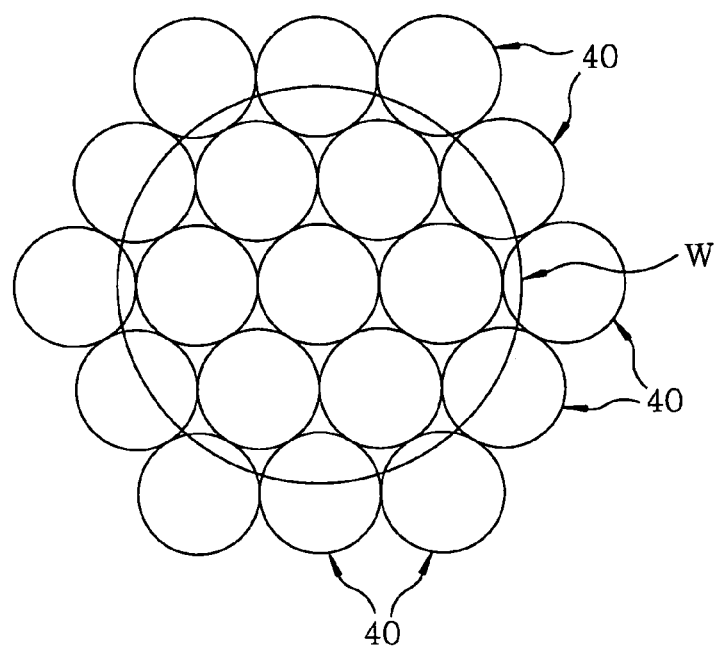
FIG. 3 describes exemplary projected patterns formed on a surface of a substrate to be processed by electron beams emitted from the electron beam tubes in the processor of FIG. 1.

FIG. 2 illustrates an arrangement of nineteen electron beam tubes 30 and FIG. 3 depicts irradiation patterns 40 formed on a surface of the semiconductor wafer W by the electron beams 38 emitted from the respective electron beam tubes 30. In this case, an arrangement of the electron beam tubes 30 or a distance between the electron beam tubes 30 and the susceptor 14 is determined such that irradiation patterns 40 of a substantially circular shape abut each other substantially.

At the ceiling portion of the chamber, a cooling gas nozzle 41 is installed near the emission window 32 of each electron beam tube 30. Cooling gas, e.g., inert gas, sprayed from the cooling gas nozzles 41 is used for cooling the emission windows 32 heated by the electron beams 38.

A process of the above-mentioned processor, e.g., a process for improving a quality of a resist film, is executed as follows. First, the gate valve 20 installed on the sidewall of the chamber 10 is opened in order to allow an external transfer arm (not shown) to load the semiconductor wafer W into the chamber 10. Thereafter, the semiconductor wafer W is handed over to the lifter pins 17 above the susceptor 14, so that the semiconductor wafer W is horizontally loaded on leading ends of the lifter pins 17. Then, the lifter pins 17 are lowered to transfer the semiconductor wafer W on top of the susceptor 14. The top surface (a surface to be processed) of the semiconductor wafer W is provided with the resist film uniformly coated thereon during a previous process.

Next, a processing gas, e.g., $N_2$ (concentration of $O_2$ being less than 300 ppm), is fed into the processing gas nozzle 18 from a processing gas source (not shown). Meanwhile, the chamber 10 is evacuated by the vacuum pump (not shown) through the exhaust port 22 and the exhaust path 24, so that inside of the chamber 10 can be maintained at a predetermined vacuum level. Further, with heat generated from the resistance heater 16 embedded in the susceptor 14 by the application of power thereto, the semiconductor wafer W loaded on top of the susceptor 14 is heated up to a certain temperature (e.g., about 100° C.) within a range, e.g., from room temperature to 500° C.

In addition, each of the electron beam tubes 30 installed at the ceiling portion of the chamber 10 is operated to irradiate the electron beam 38 of an acceleration energy ranging from 5 keV to 15 keV, e.g., 6 keV, on the top surface (a surface to be processed) of the semiconductor wafer W loaded on the susceptor 14 (a dose of 2 mC). As a result, a process for curing or improving the resist film coated on the semiconductor wafer W is carried out.

In the processor, a pressure of the depressurized space inside the chamber 10 is measured by the vacuum gauge 28 installed at the sidewall of the chamber 10 through the pressure sensing port 26, to thereby control pumping rate of the vacuum pump such that the measured pressure is equal to a preset value.

FIG. 4 presents a configuration of the pressure sensing port 26 in accordance with the preferred embodiment of the present invention. The pressure sensing port 26 has a port attachment opening 42, having a T-shaped cross section formed through the sidewall of the chamber 10, wherein a port assembly 44 capable of blocking X-rays and transmitting pressure is assembled in the port attachment opening 42.

The port assembly 44 includes a tube (pipe) 46 inserted from the inside of the chamber 10 into a small aperture portion 42a of the port attachment opening 42; an inner block 48 positioned inside a large aperture portion 42b of the port attachment opening 42 and airtightly attached to a bottom surface of the large aperture portion 42b through an O-ring 55; an intermediate block 50 positioned inside the large aperture portion 42b of the port attachment opening 42 and installed adjacent to an axially outer surface of the inner block 48; an outer block 52 positioned inside the large aperture portion 42b of the port attachment opening 42 and installed adjacent to an axially outer surface of the intermediate block 50; and a tube (pipe) 54 airtightly attached to an axially outer surface of the outer block 52 at an outside of the port, attachment opening 42 (an outside of the chamber 10).

Figure 5A:
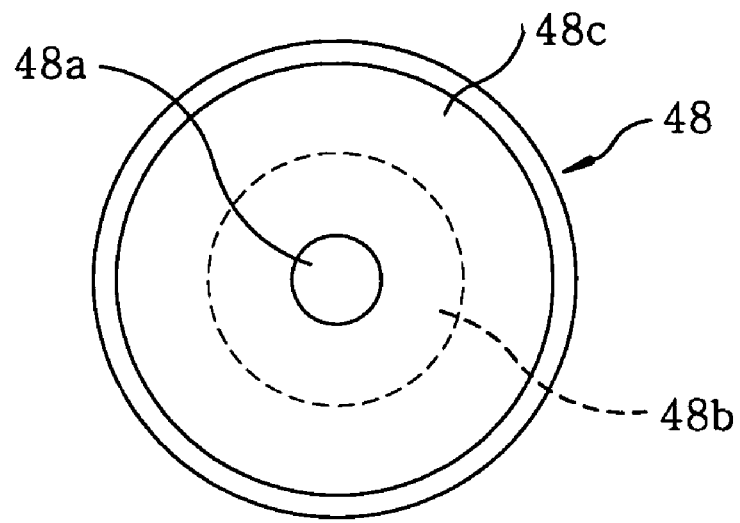
Figure 5B:
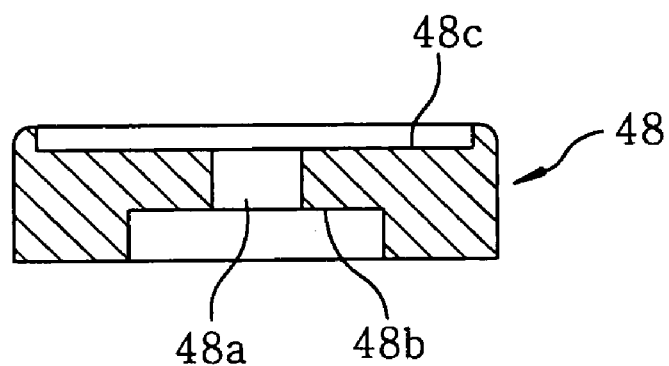

The inner block 48 is made of stainless steel, e.g., SUS304, SUS316 or SUS316L, and has a shape of generally circular plate as illustrated in FIGS. 5A and 5B. The inner block 48 includes one through hole 48a extending through a central portion thereof along an axial direction and depressed portions 48b and 48c formed on a top surface (an outer surface) and a bottom surface (an inner surface) thereof and having uniform depths, respectively.

As shown in FIG. 4, the tube 46 is protruded axially from the small aperture portion 42a of the port attachment opening 42 into the large aperture portion 42b. The protrusion is formed in a stair shape, so that the tube 46 has a thin flange portion 46a of a smaller external diameter. The inner block 48 is coaxially attached to the flange portion 46a of the tube 46 through a KF (Klein Flange) fitting, e.g., a center axis fitting ring 56, around which an O-ring 55 is placed. Specifically, an external diameter of the tube 46 and that of the ring 56 are set to be approximately equal to a diameter of the depressed portion 48b formed on the bottom surface (the inner surface) of the inner block 48 and the tube 46, the ring 56 and the inner block 48 are coaxially disposed. The O-ring 55 is inserted between a lower surface of the large aperture portion 42b and the bottom surface of the inner block 48. A diameter of the through hole 48a of the inner block 48 can be made to be approximately equal to an inner diameter of the tube 46. The tube 46 and the center axis fitting ring 56 may be made of stainless steel, e.g., SUS304, SUS 316 or SUS316L, while the O-ring 55 may be made of fluoroelastomer, e.g., Baiton (a brand name).

Figure 6A:
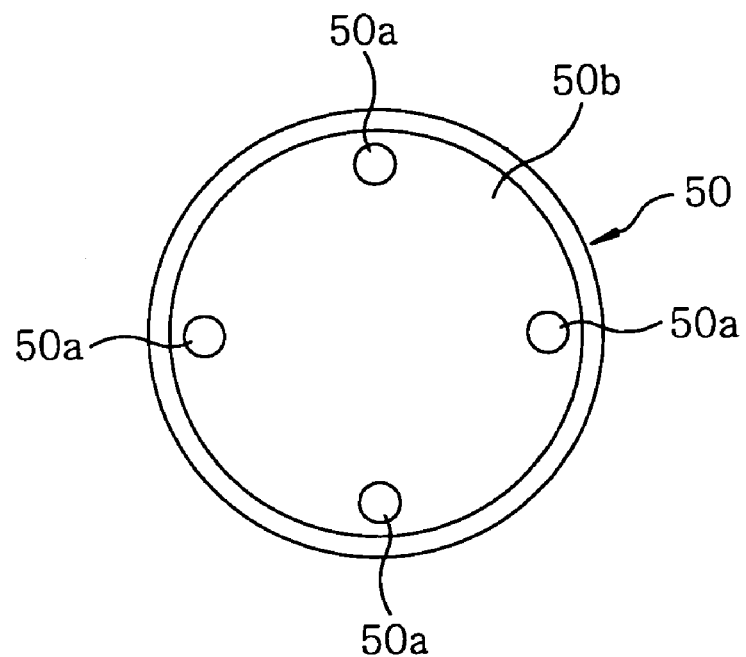
Figure 6B:
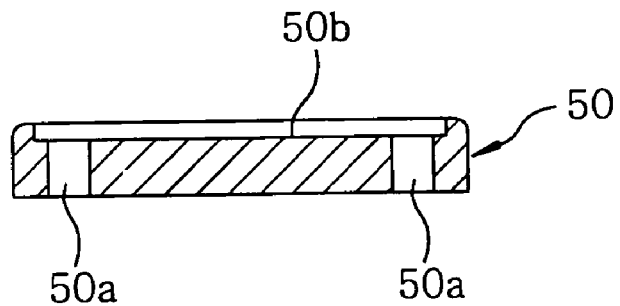

The intermediate block 50 is made of stainless steel, e.g., SUS304, SUS316, or SUS316L, and formed in a shape of an approximately circular plate as illustrated in FIGS. 6A and 6B. The intermediate block 50 is provided with a plurality of, e.g., four, through holes 50a (circumferentially spaced apart at 90° intervals) running through a peripheral portion thereof in the axial direction. A depressed portion 50b having a uniform depth is provided on a top surface (an outer surface) of the intermediate block 50. A radius or a distance from a central axis of the intermediate block 50 to each through hole 50a thereof can be considerably greater than a diameter of the through hole 48a of the inner block 48.

As shown in FIG. 4, the intermediate block 50 has a same external diameter as that of the inner block 48 and is coaxially loaded on a peripheral portion of the top surface (the outer surface) of the inner block 48. A gap is provided between a bottom surface (an inner surface) of the intermediate block 50 and the top surface (the outer surface) of the inner block 48 by the presence of the depressed portion 48c of the inner block 48. All the through holes 50a of the intermediate block 50 are open to the gap (the depressed portion 48c) and communicates with the through hole 48a of the inner block 48 and a passageway of the tube 46 via the gap (the depressed portion 48c). What is important here is that the through holes 50a of the intermediate block 50 are positioned radially further outside of the through hole 48a of the inner block 48 from the central axis of the port attachment opening 42, so that the through holes 50a do not overlap with the through hole 48a.

Figure 7A:
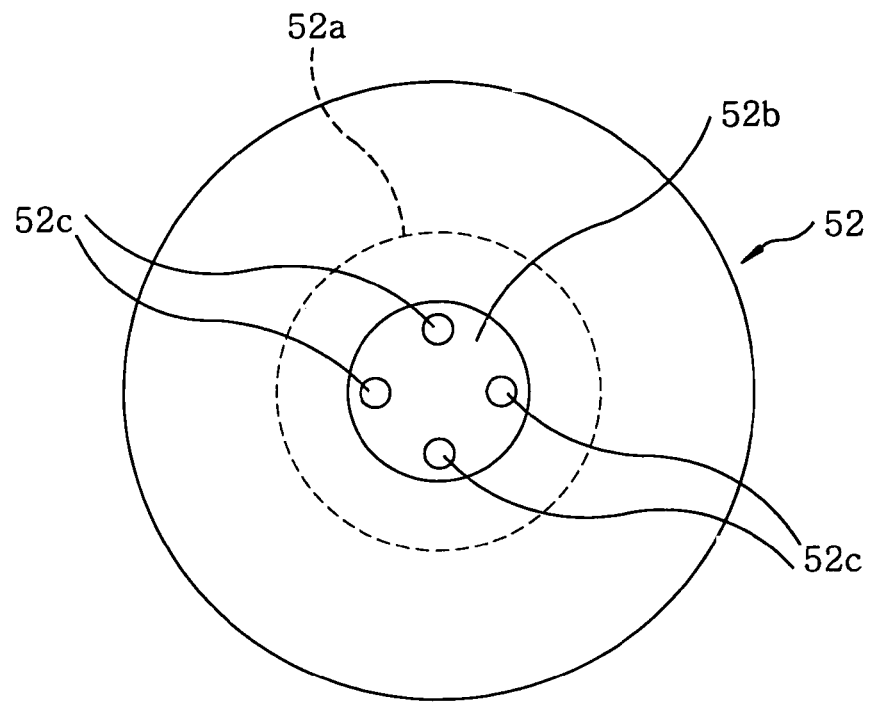
Figure 7B:
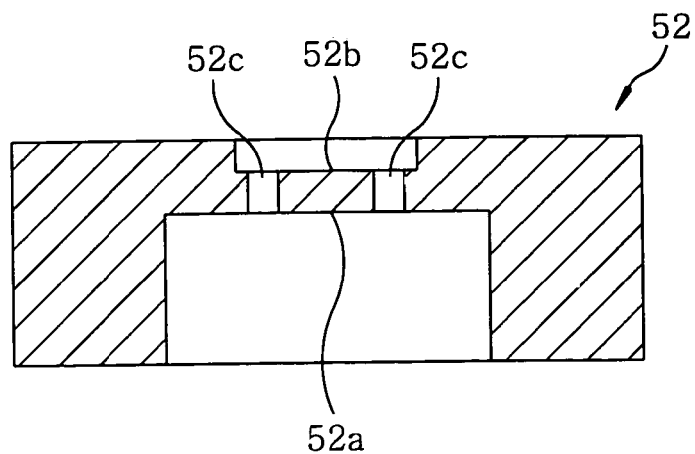

The outer block 52 is made of stainless steel, e.g., SUS304, SUS316, or SUS316L, and formed in the shape of a cup upside-down as illustrated in FIGS. 7A and 7B. The outer block 52 includes a deep depressed portion 52a of a relatively large aperture at a bottom surface (an inner surface) thereof and a shallow depressed portion 52b of a relatively small aperture at a top surface (an outer surface) thereof. Further, the outer block 52 is provided with a number of, e.g., four, through holes 52c (circumferentially spaced apart at 90° intervals) axially running through a peripheral portion of the depressed portion 52b formed on the top surface (the outer surface).

Referring back to FIG. 4, an outer diameter of the outer block 52 is determined such that the outer block 52 can be easily inserted into the large aperture portion 42b of the port attachment opening 42 and a diameter of the depressed portion 52a formed on the bottom surface (the inner surface) of the outer block 52 is determined such that the inner block 48 and the intermediate block 50 can be easily inserted thereinto. Herein, a gap is provided between the bottom surface (the inner surface) of the outer block 52 and the top surface (the outer surface) of the intermediate block 50 due to the depressed portion 50b of the intermediate block 50. The through holes 52c of the outer block 52 are open to the gap (the depressed portion 50b) and communicate with the through holes 50a of the intermediate block 50 via the gap (the depressed portion 50b). Herein, the through holes 52c of the outer block 52 are located between the through holes 50a of the intermediate block 50 and the through hole 48a of the inner block 48 in radial directions from the central axis of the port attachment opening 42, so that each of the through holes 52c, 50a, and 48a is prevented from being overlapped with each other.

A plural number of bolt through holes 52d are circumferentially provided around an outer periphery portion of the outer block 52 at regular intervals. Meanwhile, tapped holes 10a are provided at positions corresponding to those of the bolt through holes 52d of the outer block 52, on the bottom surface of the large aperture portion 42b of the port attachment opening 42 for accommodating therein the outer block 52. Bolts 58 are inserted into the bolt through holes 52d and screwed into the tapped holes 10a, so that the triple block structure of the inner block 48, the intermediate block 50, and the outer block 52 can be fixed as a single body to the chamber 10 and the O-ring 55 is compressively deformed between the inner block 48 and the bottom surface of the large aperture portion 42b to yield an airtight sealing. It is also possible that the three blocks 48, 50, and 52 are combined by welding to form a sub-assembly of a singly body.

Inserted between the outer block 52 and the tube 54 is the KF fitting, e.g., a center axis fitting ring 60, around which an O-ring 59 is attached. To be more specific, a bottom portion of the tube 54 is broadened outwardly in radial directions, to form a flange portion 54a. And, the O-ring 59 is inserted between a bottom portion of the flange portion 54a and the outer block 52. The center axis fitting ring 60 is inserted between the depressed portion 52b formed on the top surface (the outer surface) of the outer block 52 and a depressed portion formed at a bottom part of a passageway of the tube 54, with a surface of the center axis fitting ring 60 along the axial direction being coincident with those of the depressed portion 52b and the depressed portion of the tube 54 along the axial direction. The tube 54 and the center axis fitting ring 60 may be made of stainless steel, e.g., SUS304, SUS316, or SUS316L, while the O-ring 59 may also be made of fluoroelastomer, e.g., the Baiton (the brand name).

The flange portion 54a of the tube 54 is covered with a ring-shaped restraint member 62. Plural bolt through holes 62a are circumferentially disposed around a periphery portion of the restraint member 62 at regular intervals. Similarly, tapped holes 52e are provided at positions corresponding to those of the bolt through holes 62a, on the top surface (the outer surface) of the outer block 52 on which the restraint member 62 is placed. By screwing bolts 64 into the tapped holes 52e, the tube 54 is fixed on the outer block 52 through the restraint member 62. Further, the O-ring 59 is compressively deformed between the flange portion 54a of the tube 54 and the outer block 52, to thereby provide the airtight sealing.

The vacuum gauge (a pressure sensor) 28 is airtightly attached to the other end portion of the tube 54. The vacuum gauge 28 may be either a voltage vacuum gauge or a partial pressure vacuum gauge or, e.g., a capacitive vacuum gauge, a Pirani vacuum gauge or the like. The vacuum gauge 28 generates an electric signal PS, as a pressure sensing signal according to a pressure in the tube 54.

The above-described pressure sensing port 26 has a path (a communication path) formed between the chamber 10 and the vacuum gauge 28. Specifically, the chamber 10 can communicate with the vacuum gauge 28 through the path running sequentially through the passageway of the tube 46, the central through hole 48a of the inner block 48, the gap (the depressed portion 48c of the inner block 48) formed between the inner block 48 and the intermediate block 50, the peripheral through holes 50a of the intermediate block 50, the gap (the depressed portion 50b of the intermediate block 50) provided between the intermediate block 50 and the outer block 52, the through holes 52c disposed around the center of the outer block 52, and the passageway of the tube 54. Therefore, the pressure in the chamber 10 is smoothly transmitted to the vacuum gauge 28 through the above-mentioned path (the communication path). The three blocks 48, 50, and 52 form a three-step labyrinth inside the path. The labyrinth confers sufficiently large conductance to gas species and is able to have a large opening area without affecting a pressure sensing response.

Considering X-rays scattering inside the chamber 10, X-rays entering or intruding from an inside of the chamber into the port assembly 44 can be completely obstructed or blocked by the triple layer blocks 48, 50 and 52.

For example, X-rays straightly entering the passageway of the tube 46 can be multi-blocked by the intermediate block 50 and the outer block 52 even if the X-rays pass through the through hole 48a of the inner block 48. Further, X-rays intruding into the tube 46 by being reflected can be multi-blocked by at least two blocks among the inner block 48, the intermediate block 50, and the outer block 52. In addition, X-rays getting into an inside of the port assembly 44 through the chamber wall (aluminum) around the tube 46 can also be multi-blocked by at least two blocks among the inner block 48, the intermediate block 50, and the outer block 52.

In general, stainless steel having a sheet thickness of about 8 mm is able to nearly completely block X-rays emitted at the time of generating accelerated electrons having an accelerated voltage of about 10–15 KeV. Accordingly, it is preferable that a sum of thicknesses of the inner block 48, the intermediate block 50, and the outer block 52 in the axial direction is set to be greater than or equal to at least 8 mm at every portion in the path formed between the chamber 10 and the vacuum gauge 28. For instance, it is also preferable that a sheet thickness of each of the inner block 48, the intermediate block 50, and the outer block 52 in the axial direction is set to be greater than or equal to 4 mm. With the triple layer block structure having the aforementioned sheet thicknesses, X-rays intruding from any directions inside the chamber 10 can be completely blocked by the stainless steel (SUS) having a thickness of greater than or equal to 8 mm. For example, since the sum of the sheet thicknesses of the intermediate block 50 and the outer block 52 is greater than or equal to 8 mm, X-rays even passing through the through hole 48a of the inner block 48 can be completely blocked by the intermediate block 50 and the outer block 52.

In addition, by way of configuring the tube 46 disposed inside the wall of the chamber 10 to be made of stainless steel (SUS), X-rays getting into the tube 46 can be guided to the triple layer block structure disposed therein without leaking outwards and then can be completely blocked.

Once the X-rays are introduced into stainless steel (SUS), they are attenuated while passing therethrough and generates secondary and tertiary X-rays due to reflection. However, in case X-rays generated due to accelerated electrons of about 10–15 KeV are reflected three times, it is attenuated down to a level (less than or equal to 0.6 $\mu$Sv/h), the level being considered to be almost ignorable, so that the presence of quaternary X-rays may not be considered.

Figure 8:
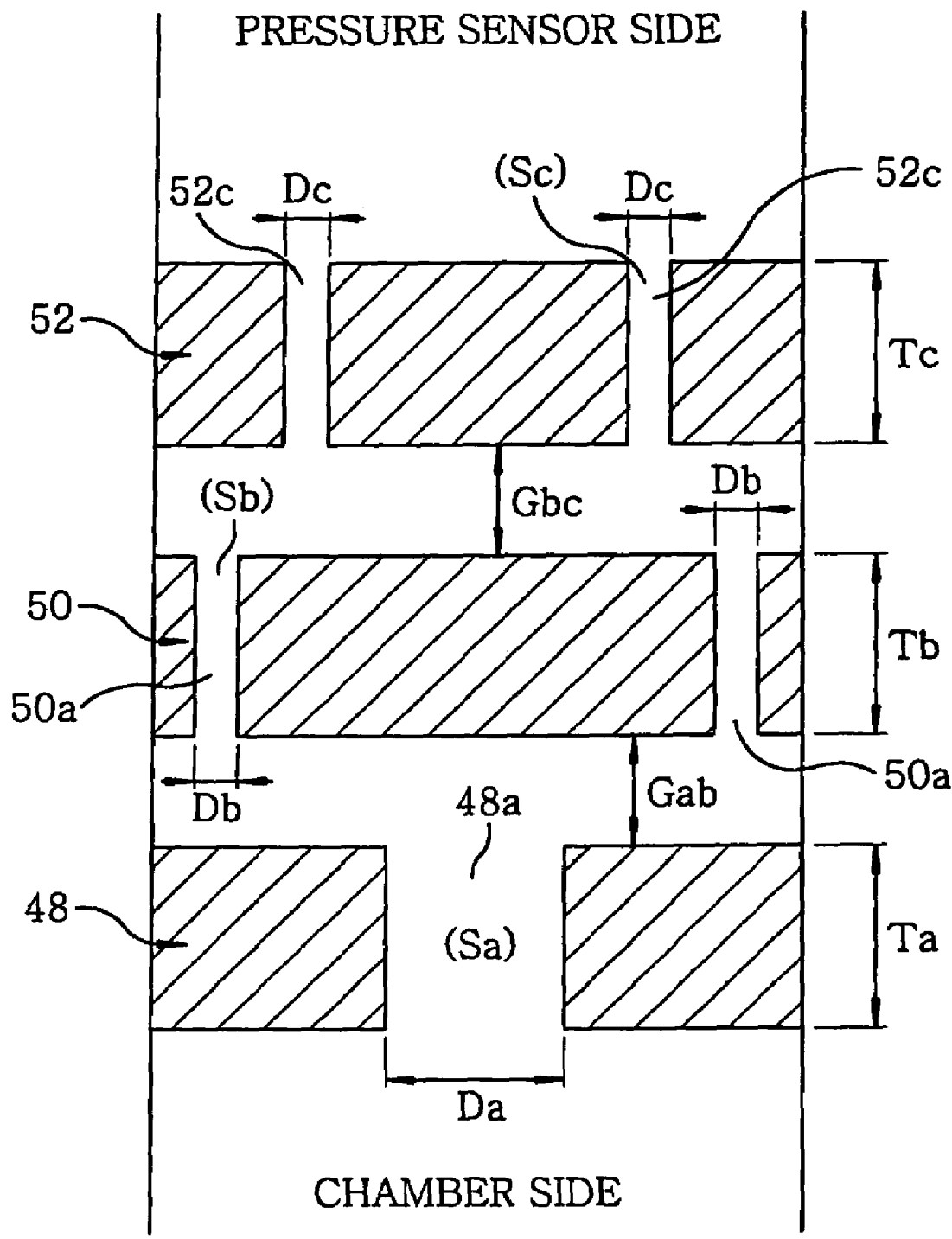
FIG. 8 provides a schematic view of a configuration of through holes, gaps and the like in a triple layer block structure.

FIGS. 8 and 9 present exemplary numerical values of through holes and gaps, which are important factors besides the sheet thickness of the blocks, in the triple layer block structure including the blocks 48, 50, and 52 in accordance with the preferred embodiment of the invention. In FIG. 9, "hole" and "*" indicate the through holes 48a, 50a or 52c and a multiplication sign, respectively.

In the preferred embodiment, as illustrated in FIG. 9, a sum of areas of holes in the inner block 48, i.e., Sa* Na, is designed to be equal to or smaller than i) ii), iii), and iv): i) is smaller one among La* Na* Gab and Lb* Nb* Gab, which respectively represent hole periphery areas of holes (through holes) 48a and 50a between the inner block 48 and the intermediate block 50; ii) is a sum of areas of holes of the intermediate block 50, i.e., Sb* Nb; iii) is a smaller one among Lb* Nb* Gbc and Lc* Nc* Gbc, which respectively represent hole periphery areas of holes (through holes) 50a and 52c between the intermediate block 50 and the outer block 52; and iv) is a sum of areas of holes of the outer block 52, i.e., Sc* Nc.

The inner block 48, the intermediate block 50, and the outer block 52 in the pressure sensing port 26 of the preferred embodiment correspond to a first, a second, and a third block of the present invention, respectively. Further, the through holes 48a, 50a and 52c correspond to the first, the second, and the third through holes of the present invention, respectively.

While the preferred embodiment of the invention has been described with reference to the accompanying drawings, the present invention is not limited thereto. It would be understood by those skilled in the art that various changes and modifications may be made without departing from the spirit of the invention as defined in the claims and such changes and modifications should be construed as belonging to the scope of the present invention.

For example, the pressure sensing port 26 of the present invention is not limited to have the triple layer block structure including the inner, the intermediate, and the outer block 48, 50, and 52; but can be a double layer or a quadruple layer block structure. For instance, the inner block 48 and the outer block 52 may be placed adjacent to each other by omitting the intermediate block 50.

With the double or the quadruple layer block structure, X-rays can be completely blocked. However, in case of the double layer block structure, a sheet thickness of each block in the axial direction should be greater than or equal to 8 mm in order to set the sum of the sheet thicknesses of the blocks in the axial direction to be greater than or equal to at least 8 mm in every portion in the path between the chamber 10 and the vacuum gauge 28. Accordingly, a net thickness of the sum of all the blocks becomes greater than or equal to 16 mm, so that the size of the port assembly 44 becomes enlarged. In case of the above-described triple layer block structure, it is sufficient to set the thickness of each block to be greater than or equal to 4 mm, so that it is possible to reduce the net thickness of the sum of all the blocks to 12 mm, enabling to reduce the size of the port assembly 44. Meanwhile, in case of a n-tuple layer structure with n being equal to or greater than 4, a labyrinth structure becomes complicated, so that it is difficult to design or manufacture the port assembly 44. Further, an aperture ratio is decreased, so that a pressure sensing response characteristic is deteriorated. Therefore, the triple layer block structure is more advantageous.

Furthermore, each part of the port assembly 44 can be made of material other than stainless steel (SUS), e.g., lead or lead-containing glass, to obtain the X-ray blocking effect. Since, however, lead-based materials have a pollution problem, it is practical and advantageous to manufacture each part of the port assembly 44 by using stainless steel (SUS).

Moreover, it is to be appreciated that the above-described chamber 10 is a mere example to which the present invention is applied. The chamber sensor port of the present invention can be applied to any chamber requiring the prevention of radioactive rays other than X-rays from being leaked out. A sensor attached to the chamber sensor port in accordance with the present invention can be any sensor capable of detecting a desired physical quantity in the chamber through the chamber sensor port, other than the above-described pressure sensor. The configuration of the parts of the processor in accordance with the preferred embodiment is also an example of the present invention. A substrate to be processed in accordance with the present invention may be an LCD substrate, a CD substrate, a glass substrate, a photomask, a print substrate, and the like, without being limited to a semiconductor wafer.

By using the above-described chamber sensor port of the present invention, it is possible to guarantee a satisfactory physical quantity sensing response characteristic and, at the same time, completely block radioactive rays.

INDUSTRIAL APPLICABILITY

The present invention can be applied to the chamber sensor port installed in a semiconductor manufacturing apparatus or the like and, particularly, to the chamber sensor port for measuring a physical quantity in the chamber in which radioactive rays are dispersed.

What is claimed is:

1. A chamber sensor port which connects a sensor for measuring a physical quantity inside a chamber to an inside of the chamber, the sensor being installed on an outside of a wall of the chamber, the chamber sensor port comprising:
   a port attachment opening formed by running through the wall of the chamber;
   a first block airtightly installed at an inside of the port attachment opening and including one or more first through holes running through in a direction of an axis of the port attachment opening;
   a second block airtightly installed at the inside of the port attachment opening, the second block being disposed adjacent to an axially outer surface of the first block and including one or more second through holes running through in the direction of the axis of the port attachment opening, the second through holes being disposed at locations not overlapping with those of the first through holes and communicating with the first through holes through a gap formed between the first and the second block;
   a third block airtightly installed between the first block and the second block and including one or more third through holes running through in the direction of the axis of the port attachment opening, the third through holes being disposed at locations not overlapping with those of the first and the second through holes and communicating with the first and the second through holes through a gap formed between the first block and the third block and a gap formed between the second block and the third block, respectively.

2. The chamber sensor port of claim 1, wherein the third block is made of a material blocking radioactive rays.

3. The chamber sensor port of claim 2, wherein each of the first, the second, and the third block has a thickness greater than or equal to one half of a sheet thickness capable of blocking the radioactive rays incident thereto from the inside of the chamber.

4. The chamber sensor port of claim 3, wherein the radioactive rays are X-rays.

5. The chamber sensor port of claim 1, wherein each of the first, the second, and the third block is made of stainless steel having a sheet thickness greater than or equal to 4 mm.

6. A chamber sensor port which connects a sensor for measuring a physical quantity inside a chamber to an inside of the chamber, the sensor being installed on an outside of a wall of the chamber, the chamber sensor port comprising:
   a port attachment opening formed by running through the wall of the chamber;
   a first block airtightly installed at an inside of the port attachment opening and including one or more first through holes running through in a direction of an axis of the port attachment opening; and
   a second block airtightly installed at the inside of the port attachment opening, the second block being disposed adjacent to an axially outer surface of the first block and including one or more second through holes running through in the direction of the axis of the port attachment opening, the second through holes being disposed at locations not overlapping with those of the first through holes and communicating with the first through holes through a gap formed between the first and the second block,
   wherein a first tube is airtightly installed in the port attachment opening, the first tube being disposed adjacent to a surface of the first block facing an inner surface of the wall of the chamber.

7. The chamber sensor port of claim 6, wherein the first tube has a diameter allowing all the first through holes to open thereto.

8. The chamber sensor port of claim 7, wherein the first block has one first through hole coaxially placed with the port attachment opening and the first tube is coaxially placed with the first through hole.

9. The chamber sensor port of claim 6, wherein the first block is airtightly attached to the inside of the port attachment opening through an O-ring.

10. The chamber sensor port of claim 6, wherein the first tube is made of stainless steel.

11. A chamber sensor port which connects a sensor for measuring a physical quantity inside a chamber to an inside of the chamber, the sensor being installed on an outside of a wall of the chamber, the chamber sensor port comprising:
   a port attachment opening formed by running through the wall of the chamber;
   a first block airtightly installed at an inside of the port attachment opening and including one or more first through holes running through in a direction of an axis of the port attachment opening; and
   a second block airtightly installed at the inside of the port attachment opening, the second block being disposed adjacent to an axially outer surface of the first block and including one or more second through holes running through in the direction of the axis of the port attachment opening, the second through holes being disposed at locations not overlapping with those of the first through holes and communicating with the first through holes through a gap formed between the first and the second block,
   wherein a second tube extending to the sensor is airtightly attached to a surface of the second block adjacent to an outer surface of the wall of the chamber.

12. The chamber sensor port of claim 11, wherein the second tube has a diameter allowing all the second through holes to be open thereto.

13. The chamber sensor port of claim 11, wherein a center axis fitting ring around which an O-ring is attached is installed between the second tube and the second block.

14. An electron beam processor comprising a chamber sensor port which connects a sensor for measuring a physical quantity inside a chamber to an inside of the chamber, the sensor being installed on an outside of a wall of the chamber, the chamber sensor port including:
   a port attachment opening formed by running through the wall of the chamber;
   a first block airtightly installed at an inside of the port attachment opening and including one or more first through holes running through in a direction of an axis of the port attachment opening; and
   a second block airtightly installed at the inside of the port attachment opening, the second block being disposed adjacent to an axially outer surface of the first block and including one or more second through holes running through in the direction of the axis of the port attachment opening, the second through holes being disposed at locations not overlapping with those of the first through holes and communicating with the first through holes through a gap formed between the first and the second block.

* * * * *